US012802927B2

(12) United States Patent
Wills

(10) Patent No.: US 12,802,927 B2
(45) Date of Patent: Nov. 17, 2026

(54) SCANNED BEAM DOSE RATE MEASUREMENT FOR ION BEAM OPTIMIZATION

(71) Applicant: Applied Materials, Inc., Santa Clara, CA (US)

(72) Inventor: Tyler Wills, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 18/960,922

(22) Filed: Nov. 26, 2024

(65) Prior Publication Data

US 2026/0148932 A1 May 28, 2026

(51) Int. Cl.
*H01J 37/317* (2006.01)
*H01J 37/304* (2006.01)

(52) U.S. Cl.
CPC ...... *H01J 37/3171* (2013.01); *H01J 37/3045* (2013.01); *H01J 2237/20228* (2013.01); *H01J 2237/30483* (2013.01); *H01J 2237/31703* (2013.01)

(58) Field of Classification Search
CPC ............... H01J 37/3171; H01J 37/3045; H01J 2237/20228; H01J 2237/30483; H01J 2237/31703
See application file for complete search history.

(56) References Cited

U.S. PATENT DOCUMENTS

| | | | |
|---|---|---|---|
| 6,573,518 B1 | 6/2003 | Renau et al. | |
| 2008/0087808 A1 | 4/2008 | Ledoux et al. | |
| 2018/0105928 A1* | 4/2018 | Wang | H10N 60/203 |

FOREIGN PATENT DOCUMENTS

| | | | |
|---|---|---|---|
| JP | 2020153748 A | 9/2020 | |
| KR | 1020020019596 A | 3/2002 | |
| WO | WO-0111659 A1 * | 2/2001 | H01J 37/32412 |

OTHER PUBLICATIONS

International Search Report and Written Opinion for International Application No. PCT/US2025/048206, mailed on Jan. 27, 2026, 10 pages.

* cited by examiner

*Primary Examiner* — Andrew Smyth
(74) *Attorney, Agent, or Firm* — KDW Firm PLLC

(57) ABSTRACT

A method of measuring and optimizing dose rate variation in an ion implantation system, the method including generating a scanned beam according to a beam recipe provided to the ion implantation system, moving a profiler head across the scanned beam, the profiler head including a current sensing array including at least one current sensing device adapted to measure a dose rate of the scanned beam for generating a scanned beam profile of the scanned beam, identifying peak current values across the scanned beam profile and deriving a first dose rate profile therefrom, comparing at least one metric associated with the first dose rate profile to at least one corresponding dose rate variation target to determine whether the first dose rate profile is sufficiently uniform, and if the first dose rate profile is not sufficiently uniform, adjusting settings of the beam shaping components so that the scanned beam has a second dose rate profile that is more uniform than the first dose rate profile.

18 Claims, 6 Drawing Sheets

SCANNED BEAM DOSE RATE MEASUREMENT FOR ION BEAM OPTIMIZATION

FIELD OF THE DISCLOSURE

Embodiments of the present disclosure relate to the field of ion beam implantation systems, and more particularly, to systems and methods for measuring and optimizing dose rate variation in ion beams.

BACKGROUND OF THE DISCLOSURE

Ion implantation is a technique commonly employed for introducing impurities, in the form of ionized dopant particles, into a semiconductor workpiece to affect the conductivity of the workpiece in a desired manner. In some ion beam implantation systems, a "spot ion beam" (or "spot beam") is formed of ionized particles and is scanned across a workpiece to implant the ions therein. A spot beam is an ion beam in which ions are projected as a beam having a generally circular or oval cross-sectional shape and a cross-sectional size that is significantly smaller than a surface area of a workpiece onto which the spot beam is projected. A spot beam may be projected through an electrostatic scanner adapted to controllably deflect the spot beam at varying angles in a first direction. For example, an electrostatic scanner may deflect the spot beam in a horizontal direction. The amount of deflection may be sufficient to scan the spot beam across the entire diameter of a workpiece that is being processed by the spot beam. Thus, the spot beam, which may have a width that is significantly smaller than a width of the workpiece, may be scanned horizontally across the workpiece to implant the entire width of the workpiece. Typically, a workpiece is disposed on a movable workpiece holder that is movable in a second direction perpendicular to the first direction. For example, the workpiece holder may translate the workpiece in a vertical direction. In this way, the entirety of the workpiece may be processed by the spot beam. In other words, the spot beam may be deflected back and forth in the first direction (e.g., horizontally), while the workpiece is translated in the second direction (e.g., vertically).

Ideally, when a spot beam is scanned horizontally across a workpiece, the vertical distribution of ions in the spot beam remains consistent. That is, the vertical distribution of ions in the ion beam ideally remains unchanged regardless of the horizontal position of the ion beam during scanning. However, due to non-uniformities in electrostatic scanners and other components of ion beam implantation systems, the vertical distribution of ions in a spot beam can exhibit significant variation ("dose rate variation") as a function of the horizontal position of the spot beam. If left unaccounted for, such dose rate variation can result in a semiconductor workpiece being implanted in a highly non-uniform manner, which can detrimentally impact the performance of a resulting semiconductor device or render the semiconductor workpiece entirely useless.

In order to counteract dose rate variation (e.g., via manipulation of dose rate and ion beam shape during scanning), the dose rate variation must first be measured. This is typically accomplished by performing one or more test implants on actual semiconductor workpieces. Metrology processes (e.g., "Therma-Wave" scanning) can then be used to measure the implanted dose in a workpiece to reveal non-uniformities associated with dose rate variation. This method is time consuming and is also associated with significant waste and expense, as actual semiconductor workpieces must be used and discarded.

In view of the above, it would be advantageous to provide a system and a method for accurately predicting dose rate variation in an efficient, expeditious, and cost-effective manner. With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

An ion implantation system in accordance with an embodiment of the present disclosure may include an ion source from which a spot beam is extracted, a scanner which scans the spot beam in a first direction to create a scanned beam directed at a movable workpiece holder adapted to support a semiconductor workpiece, and a movable beam profiler having a profiler head movable in the first direction across a path of the scanned beam. The profiler head may include a current sensing array comprising at least one current sensing device adapted to measure a dose rate of the scanned beam for generating a scanned beam profile of the scanned beam. The ion implantation system may further include beam shaping components adapted to change a shape of the spot beam and a shape of the scanned beam, and a main controller operatively coupled to the ion source, the scanner, the movable beam profiler, and the beam shaping components. The main controller may be adapted to identify peak current values across the scanned beam profile and to derive a first dose rate profile therefrom, and may be further be adapted to adjust settings of the beam shaping components so that the scanned beam has a second dose rate profile that is more uniform than the first dose rate profile.

A method of measuring and optimizing dose rate variation in an ion implantation system in accordance with an embodiment of the present disclosure may include generating a scanned beam according to a beam recipe provided to the ion implantation system and moving a profiler head across the scanned beam. The profiler head may include a current sensing array including at least one current sensing device adapted to measure a dose rate of the scanned beam for generating a scanned beam profile of the scanned beam. The method may further include identifying peak current values across the scanned beam profile and deriving a first dose rate profile therefrom and comparing at least one metric associated with the first dose rate profile to at least one corresponding dose rate variation target to determine whether the first dose rate profile is sufficiently uniform. If the first dose rate profile is not sufficiently uniform, the method may further include adjusting settings of the beam shaping components so that the scanned beam has a second dose rate profile that is more uniform than the first dose rate profile.

BRIEF DESCRIPTION OF THE DRAWINGS

By way of example, various embodiments of the disclosed techniques will now be described with reference to the accompanying drawings, wherein.

DETAILED DESCRIPTION

Figure 1:
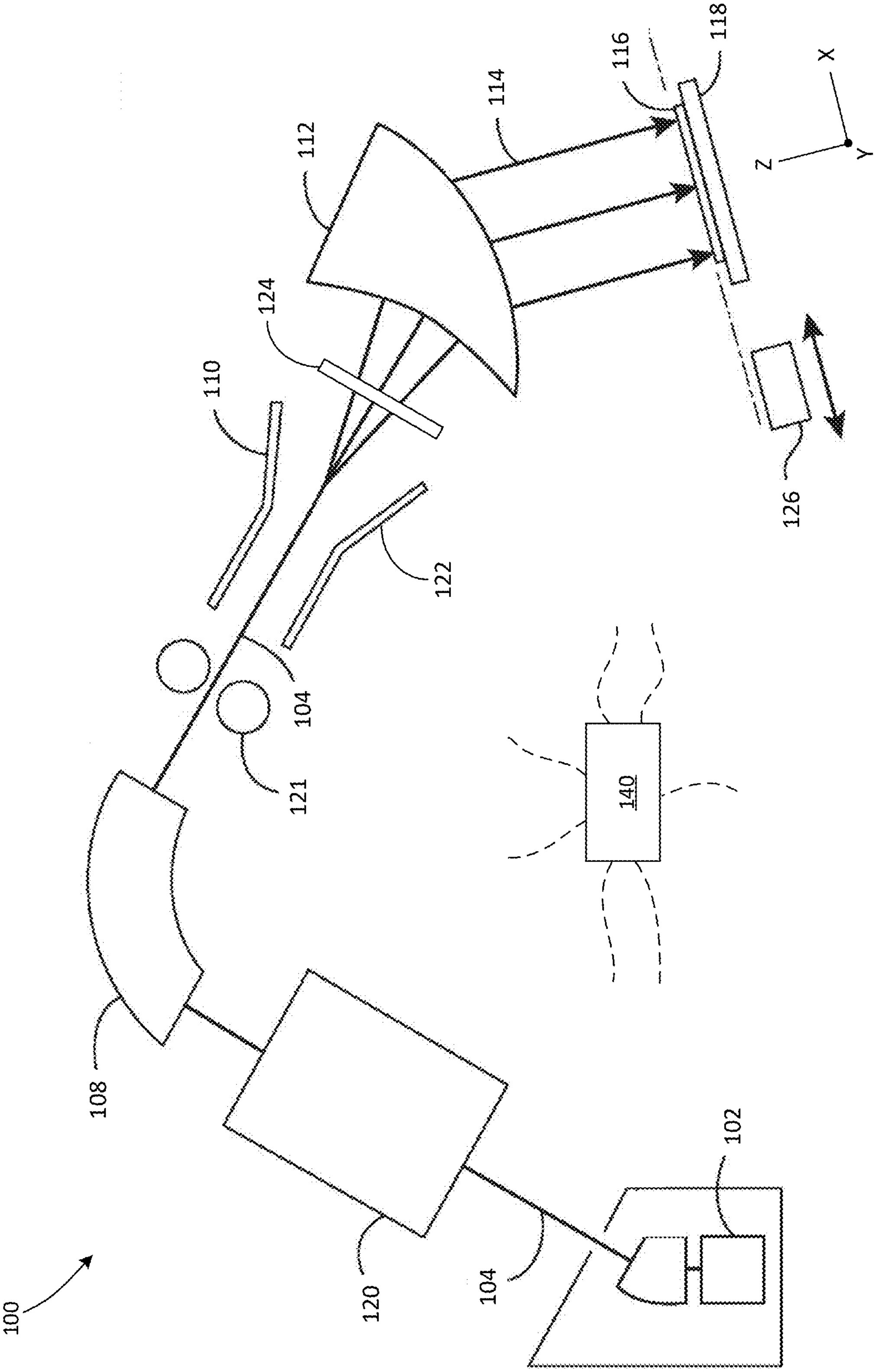
FIG. 1 is a schematic view illustrating an example of an ion implantation system in accordance with the present disclosure.

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, various embodiments herein have been described in the context of one or more elements or components. An element or component may comprise any structure arranged to perform certain operations. Although an embodiment may be described with a limited number of elements in a certain topology by way of example, the embodiment may include more or less elements in alternate topologies as desired for a given implementation. Note any reference to "one embodiment" or "an embodiment" means a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

The present embodiments provide systems and methods for measuring and optimizing the dose rate variation of a scanned ion beam during an ion beam implantation process. The term "dose rate variation" as used herein refers to variation in the distribution of ions in a spot ion beam as a function of the spot ion beam's position during scanning. The systems and method of the present disclosure facilitate accurate prediction and optimization of dose rate variation in a manner that promotes throughput and reduces waste.

Referring to FIG. 1, an ion beam implantation system 100 (hereinafter "the ion implanter 100") according to an embodiment of the present disclosure is shown. The ion implanter 100 may include an ion source 102 adapted to generate ions that are extracted from the ion source 102 in the form of a spot ion beam 104 (hereinafter "the spot beam 104") having a generally circular or oval cross-sectional shape. The ion source 102 may generate ions using any suitable technique (e.g., electron ionization, chemical ionization, plasma, electric discharge, etc.) and the spot beam 104 may be extracted from the ion source 102 using any of a variety of electrode configurations (sometimes referred to as "extraction optics") familiar to those of skill in the art. The present disclosure is not limited in this regard.

The ion implanter 100 may further include a mass analyzer 108 located downstream from the ion source 102. The mass analyzer 108 may use magnetic fields to influence and guide the path of ions within the spot beam 104. The magnetic fields affect the flight path of ions according to their mass and charge. By proper selection of the magnetic fields, only those ions having a selected mass and charge will be directed through the mass analyzer 108. Other of the ions will be trapped by the mass analyzer 108 and will not travel any further through the ion implanter 100.

The spot beam 104 may then enter a scanner 110 located downstream from the mass analyzer 108. The scanner 110 may cause the spot beam to be fanned out into a "ribbon" formed of a plurality of divergent beamlets. The scanner 110 may be electrostatic or magnetic. A collimator 112 located downstream from the scanner 110 may then redirect the divergent beamlets into a plurality of parallel beamlets forming a scanned ion beam 114 (hereinafter "the scanned beam 114) that is directed toward a semiconductor workpiece 116 (hereinafter "the workpiece 116").

The workpiece 116 may be disposed on a movable workpiece holder 118. In certain embodiments, the direction in which the scanned beam 114 travels immediately prior to striking the workpiece 116 is referred to as the Z-direction. The direction perpendicular to the Z-direction and horizontal may be referred to as the X-direction. The direction perpendicular to the Z-direction and vertical may be referred to as the Y-direction. Thus, during an implantation process, the scanner 110 may scan the spot beam 104 back and forth in the X-direction (i.e., horizontally) while the movable workpiece holder 118 is translated in the Y-direction (i.e., vertically). In various embodiments, these directions may be reversed, with the scanner 110 scanning the spot beam 104 back and forth in the Y-direction (i.e., vertically) while the movable workpiece holder 118 is translated in the X-direction (i.e., horizontally). The present disclosure is not limited in this regard.

The ion implanter 100 may further include various beam shaping components for selectively manipulating the shape of the spot beam 104 and/or the shape of the scanned beam 114. For example, the ion implanter 100 may include an early beam focusing element 120 (hereinafter "the focus voltage 120") located between the ion source 102 and the mass analyzer 108. The focus voltage 120 may use electrostatic voltage to focus the spot beam 104 (e.g., to adjust the height, width, and transmission characteristics of the spot beam 104).

The beam shaping components of the ion implanter 100 may further include optical elements 121 located downstream from the mass analyzer 108. The optical elements 121 may employ a magnetic or electrical field to focus, defocus, and/or steer the spot beam 104. Examples of optical elements 121 include a quadrupole magnet. A "quad 3" magnet, for example, can be set to a quad mode or a dipole mode, where the quad mode may be used to control the spot beam 104 height and shape, while the dipole mode may be used to steer the spot beam vertically. The present disclosure is not limited in this regard.

The beam shaping components of the ion implanter 100 may further include a scanner offset control 122 that may be integral with the scanner 110. The scanner offset control 122 may facilitate electrostatic shifting of the scan origin of the spot beam 104.

The beam shaping components of the ion implanter 100 may further include a post scan suppression element 124 located downstream from the scanner 110. The post scan suppression element 124 may include an electrostatic lens capable of increasing/decreasing the size of the scanned beam 114.

The above described beam shaping components of the ion implanter 100 are provided by way of example only. The ion implanter 100 may include various additional or alternative components or elements for controllably adjusting the shape, size, and other attributes of the spot beam 104 and/or the scanned beam 114. Such components and their effects on the spot beam 104 and/or the scanned beam 114 will be familiar to those of skill in the art and their inclusion/exclusion will depend on the particular ion implanter used and its intended applications.

The ion implanter 100 may further include a movable beam profiler 126, which may be located adjacent the movable workpiece holder 118. The movable beam profiler 126 may be adapted to measure beam current across the scanned beam 114 to develop a beam profile thereof as further described below. During a beam profiling process, the movable workpiece holder 118 may be moved out of the path of the scanned beam 114 (out of a nominal, "implantation position"), and the movable beam profiler 126 may be translated across the scanned beam 114 in the X-direction, along substantially the same plane previously occupied by the front surface of the movable workpiece holder 118. Alternatively, the movable workpiece holder 118 may be left in its implantation position and the movable beam profiler 126 may be translated across the scanned beam 114 in front of the movable workpiece holder 118. Thus, the movable beam profiler 126 may measure the beam current of the scanned beam 114 at substantially the same locations where the scanned beam 114 would normally impinge on a semiconductor workpiece (e.g., the workpiece 116) during an ion implantation process.

Figure 2:
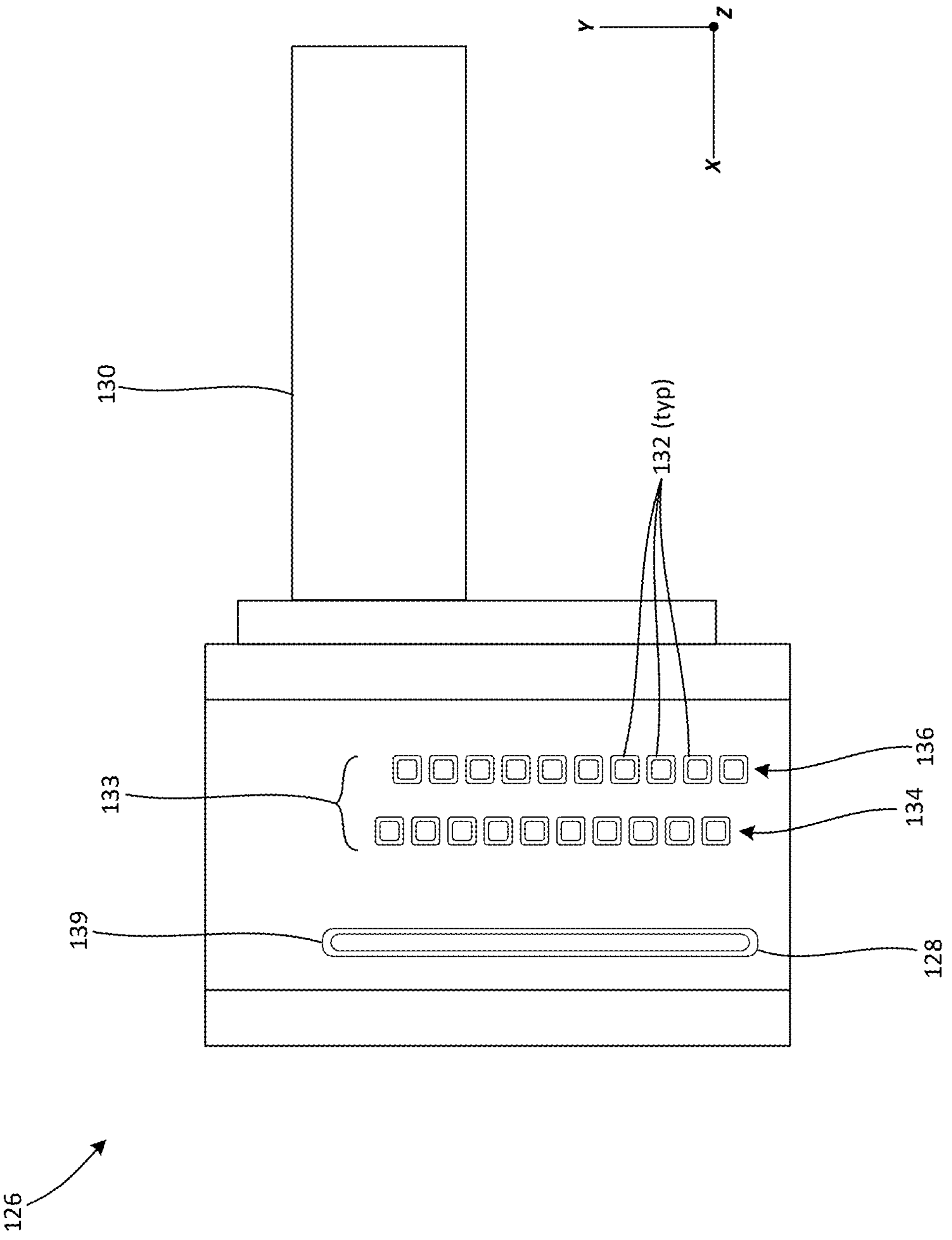
FIG. 2 is a front view illustrating an embodiment of a movable beam profiler of the ion implantation system shown in FIG. 1.

Referring to FIG. 2, a detailed view illustrating the movable beam profiler 126 in isolation is shown. The movable beam profiler 126 may include a profiler head 128 mounted on a translation arm 130. The profiler head 128 may be controllably movable along a track of the translation arm 130 (e.g., driven by a servo motor or the like), such as back and forth in the X-direction, thereby facilitating horizontal movement of the profiler head 128 across the scanned beam 114 as described above.

The profiler head 128 may include a plurality of current sensing devices 132, hereinafter collectively referred to as "the current sensing array 133," arranged in one or more vertically extending columns (i.e., extending in the Y-direction, perpendicular to the direction of movement of the profiler head 128). For example, as shown in FIG. 2, the current sensing devices 132 may be arranged in a first column 134 and a second column 136, wherein the second column 136 may be horizontally spaced apart from, and may be vertically offset relative to, the first column 134. Owing to the vertical offset of the first and second columns 134, 136 relative to one another, the current sensing devices 132 in the second column 136 may capture portions of the scanned beam 114 that pass between the current sensing devices 132 in the first column 134 (and that would otherwise be uncaptured) as the profiler head 128 is translated horizontally leftward (relative to the orientation depicted in FIG. 2) across the scanned beam 114 as further described below.

In various embodiments, the current sensing devices 132 may be Faraday devices ("Faraday cups"). The present disclosure is not limited in this regard, and the current sensing devices 132 may alternatively be graphite strips or any other component or device adapted to measure beam current in the scanned beam 114. Moreover, the scope of the present disclosure is not limited to the specific number of current sensing devices 132 and the arrangement of the current sensing array 133 described above. Various embodiments of the present disclosure may include a current sensing array 133 having a fewer or greater number of current sensing devices 132 arranged in a fewer or greater number of columns. Most fundamentally, the current sensing array 133 includes at least one current sensing device having a height less than a height of the scanned beam 114 (as measured in the Y-direction) and positioned on the profiler head 128 such that the at least one current sensing device passes across the vertical center (or near the vertical center) of the scanned beam 114 when the profiler head 128 is moved horizontally across the scanned beam 114.

Figure 3:
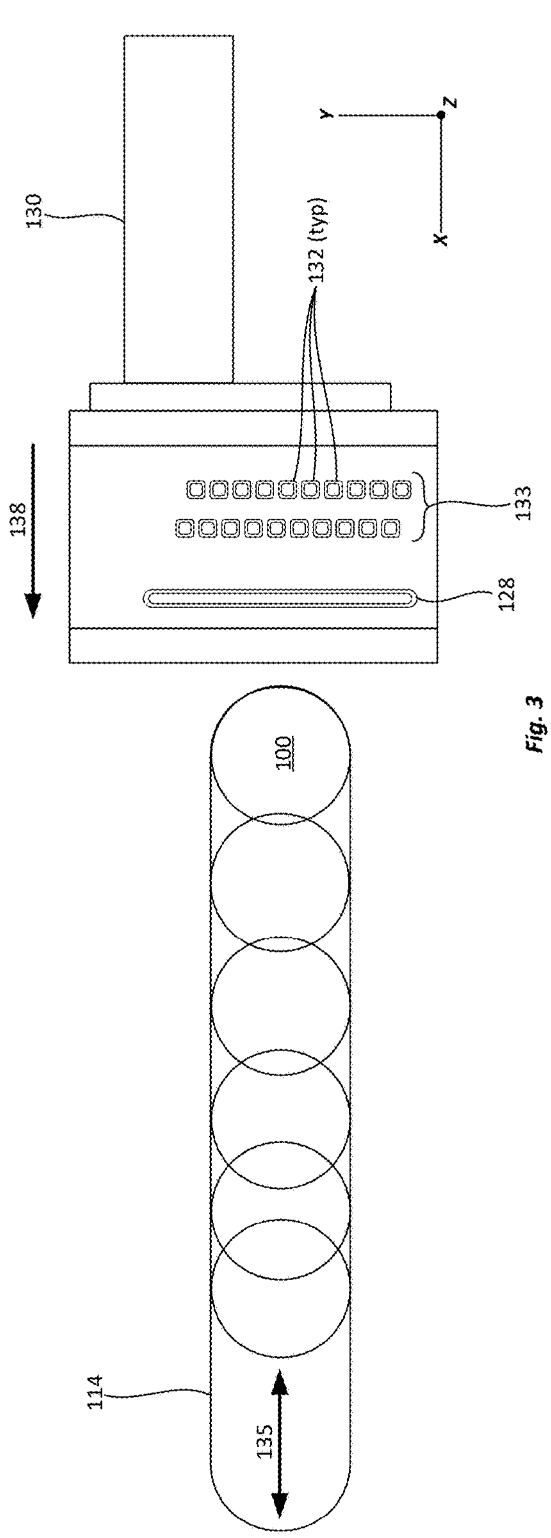
FIG. 3 is a front view illustrating the movable beam profiler shown in FIG. 2 adjacent a scanned ion beam.
Figure 4:
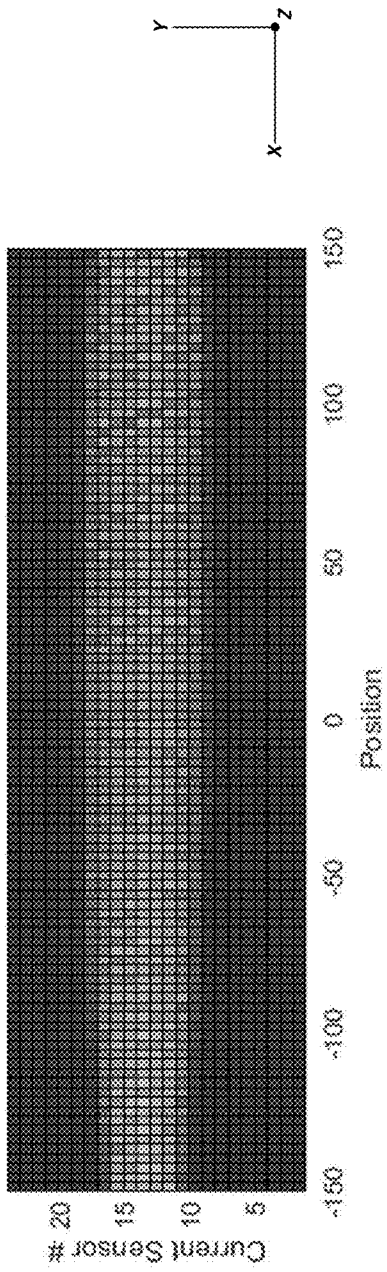
FIG. 4 is a chart illustrating an exemplary scanned beam profile generated by the movable beam profiler shown in FIG. 2.

Referring to FIG. 3, the profiler head 128 is shown adjacent the scanned beam 114 (the scanned beam 114 is depicted as being projected into the page, in the Z-direction, in this view), wherein the scanned beam 114 is formed by scanning the spot beam 104 back and forth in the X-direction as described above and as indicated by arrow 135. The current sensing array 133 may be used to perform a scanned beam profiling operation, wherein the profiler head 128 may move horizontally across the scanned beam 114 in the X-direction as indicated by arrow 138. As the profiler head 128 moves across the scanned beam 114, beam current in the scanned beam 114 may impinge upon, and may be measured at, each of the vertically distributed current sensing devices 132. In this way, the profiler head 128 may provide a "scanned beam profile" of the scanned beam 114 in the form of a pixelated, 2-dimensional representation, where each pixel in the scanned beam profile quantifies an amount of beam current at a given 2-dimensional position. An example of such a scanned beam profile is shown in FIG. 4, wherein the rows of pixels along the vertical axis of the scanned beam profile correspond to the plurality of vertically distributed current sensing devices 132 on the profiler head 128, and wherein the columns of pixels along the horizontal axis of the scanned beam profile correspond to 3 millimeter-wide segments across a width of the scanned beam 114 (wherein the example scanned beam 114 is 300 millimeters wide for processing a conventional, 300 millimeter wide semiconductor workpiece). Of course, the aforementioned dimensional values are not intended to be limiting and may vary in accordance with a particular ion implanter and a particular application.

The scanned beam profile provided by the profiler head 128 facilitates the quantification of a "dose rate" of the scanned beam 114 as a function of horizontal position within the scanned beam 114, where "dose rate" refers to a vertical distribution of beam current at a given horizontal position. Dose rate variation across the width of the scanned beam 114 may thus be observed. In the example scanned beam profile shown in FIG. 4, it can be seen that the scanned beam 114 shortens or shrinks vertically toward the left side of the scanned beam 114. Since total beam current is ideally (though not necessarily) uniform across the entire width of the scanned beam 114, this shortening toward the left side results in the measured beam current being more concentrated toward a vertical center of the scanned beam 114 as compared to the relatively taller, right side of the scanned beam 114 where the beam current is more vertically diffuse.

This may represent an undesirable dose rate variation in the scanned beam 114, correlating to a non-uniform, "bad" shape of the scanned beam 114, that may be remedied through manipulation of the beam shaping components of the ion implanter 100 (see FIG. 1) as further described below.

Referring again to FIG. 2, the profiler head 128 may further include a profiler dose slot 139 defined by a single, vertically elongated current sensing device (e.g., a Faraday device). The profiler dose slot 139 may have a height in the Y-direction that is at least as tall as a height of the scanned beam 114 and may have a width in the X-direction of 1 or more millimeters. The present disclosure is not limited in this regard.

The profiler dose slot 139 may be used to perform a uniformity profiling operation, wherein the profiler head 128 is moved across the scanned beam 114 as the profiler dose slot 139 captures an entirety of the height of the scanned beam 114. This may be performed concurrently with scanned beam profiling operation described above (i.e., during the same horizontal pass of the profiler head 128 across the scanned beam 114). Thus, the profiler dose slot 139 may measure a total beam current of the scanned beam 114 at each horizontal position across the entire width of the scanned beam 114. Undesirable variations in the total beam current across the scanned beam 114 may thus be identified, and such variations may be remedied through manipulation of beam current as a function of horizontal position within the scanned beam 114 as further described below.

Referring again to FIG. 1, the ion implanter 100 may further include a main controller 140 operatively coupled to the various components of the ion implanter 100 described above, including the beam shaping components and the movable beam profiler 126, for controlling and coordinating the operation of such components as further described below. The main controller 140 may include a processor, such as a known type of microprocessor, dedicated semiconductor processor chip, general purpose semiconductor processor chip, or similar device. The main controller 140 may further include a memory or memory unit coupled to the processor, where the memory unit may contain software for executing various processes as described below.

The memory unit of the main controller 140 may comprise an article of manufacture. In one embodiment, the memory unit may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

Any or all of the above-described beam shaping components of the ion implanter 100 may be manipulated or adjusted by changing one or more settings of such components via the main controller 140. These settings, which may serve as tunable parameters as described below, include, but are not limited to, positioning of mechanical aperture elements, focus voltage, magnet current, amount of force applied to a force-driven optical element, electrostatic optical element current, post scan suppression, scanner offset, source life, cell suppression, scanned beam velocity, etc. The present disclosure is not limited in this regard. Thus, the various beam shaping components of the ion implanter 100 may be associated with one or more tunable parameters than can be changed to affect the shape and/or other attributes of the spot beam 104 and/or the scanned beam 114.

Figure 5:
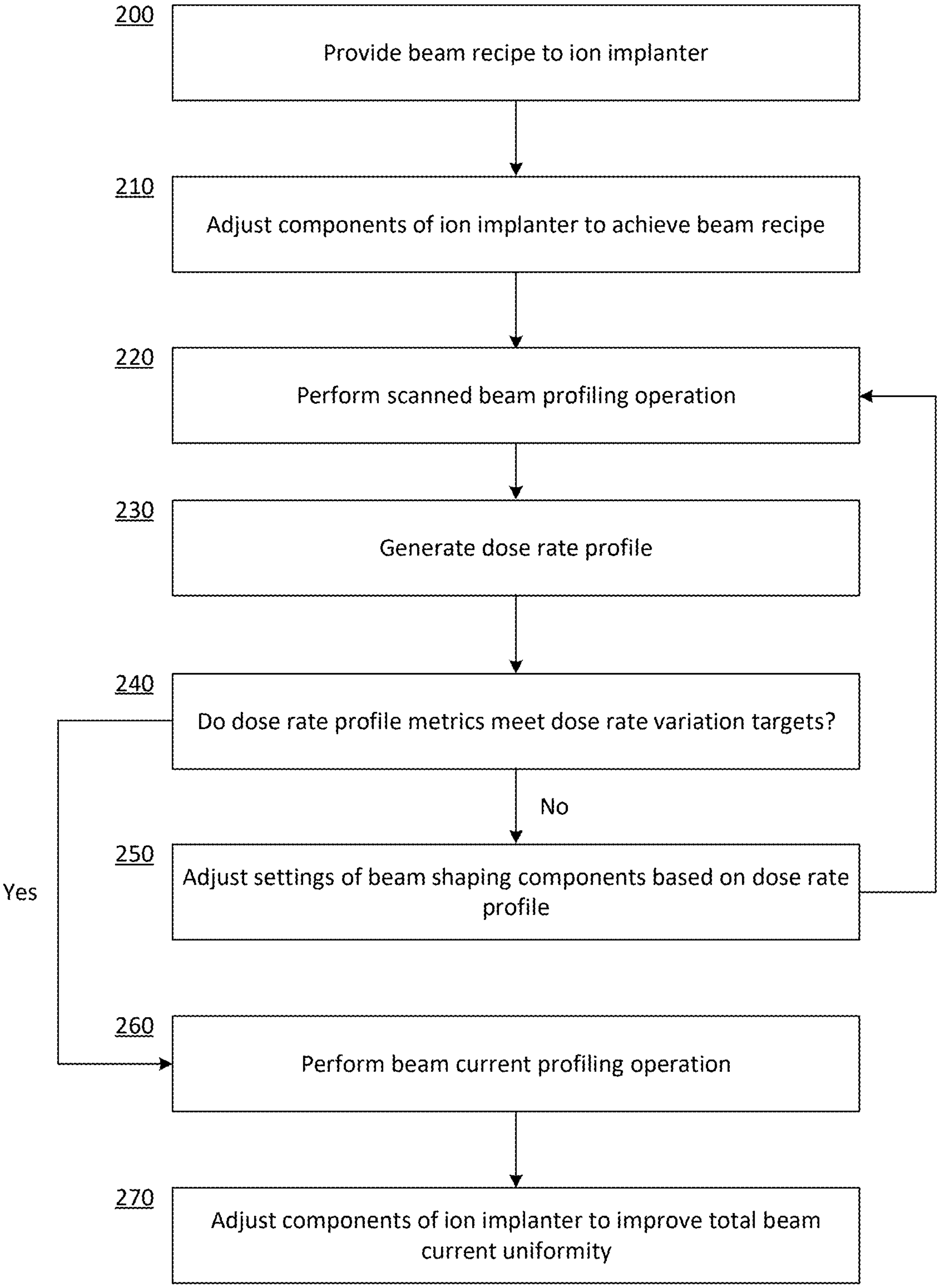
FIG. 5 is a flow diagram illustrating a method of measuring and optimizing a dose rate of a scanned ion beam in accordance with the present disclosure.

Referring now to FIG. 5, a flow diagram illustrating a method for measuring and optimizing dose rate variation in a scanned ion beam is shown. The method will be described with reference to the ion implanter 100 shown in FIG. 1 and the movable beam profiler 126 shown in FIG. 2. It will be understood that the various processes described below may be executed automatically or manually via the main controller 140 of the ion implanter 100, such as may be dictated and/or assisted by computer executable instructions stored in the memory unit of the main controller 140. The present disclosure is not limited in this regard.

In block 200 of the method shown in FIG. 5, a set of initial beam parameters, sometimes referred to as a "beam recipe," may be supplied to the ion implanter 100 (e.g., to the main controller 140 of the ion implanter 100) for generating a scanned beam 114 that meets certain basic requirements with regard to implant dose, target current, number of passes, angle requirements, etc., such as may be appropriate for a particular application. In various embodiments, the beam recipe may be established using a beam generation tool and an initial tuning algorithm as will be familiar to those of skill in the art. The present disclosure is not limited in this regard.

In block 210 of the method shown in FIG. 5, various components of the ion implanter 100 may be manipulated or adjusted (e.g., via the main controller 140) in a manner intended to achieve the beam recipe established in block 200. This may involve manipulation or adjustment of various settings, including source voltage, extraction voltage, extraction gap, positioning of mechanical aperture elements, focus voltage, magnet current, force applied to a force-driven optical element, electrostatic optical element current, post scan suppression, scanner offset, source life, cell suppression, scanned beam velocity, etc. The present disclosure is not limited in this regard. Once the aforementioned settings have been established, the ion implanter 100 may be operated to generate the spot beam 104 and the scanned beam 114.

In block 220 of the method shown in FIG. 5, the movable beam profiler 126 may be employed to perform a scanned beam profiling operation, wherein the profiler head 128 may be moved horizontally across the scanned beam 114 in the X-direction. As the profiler head 128 moves across the scanned beam 114, beam current in the scanned beam 114 may impinge upon, and may be measured at, each of the vertically distributed current sensing devices 132 in the current sensing array 133. Using the measured current, the profiler head 128 may provide a scanned beam profile of the scanned beam 114 as described above. An example of a scanned beam profile is shown in FIG. 4, wherein the rows of pixels along the vertical axis of the scanned beam profile correspond to the plurality of vertically distributed current sensing devices 132 on the profiler head 128, and wherein the columns of pixels along the horizontal axis of the scanned beam profile correspond to 3 millimeter-wide segments across a width of the scanned beam 114 (wherein the example scanned beam 114 is 300 millimeters wide for processing a conventional, 300 millimeter wide semiconductor workpiece). Of course, the aforementioned dimensional values are not intended to be limiting and may vary in accordance with a particular ion implanter and a particular application.

Figure 6A:
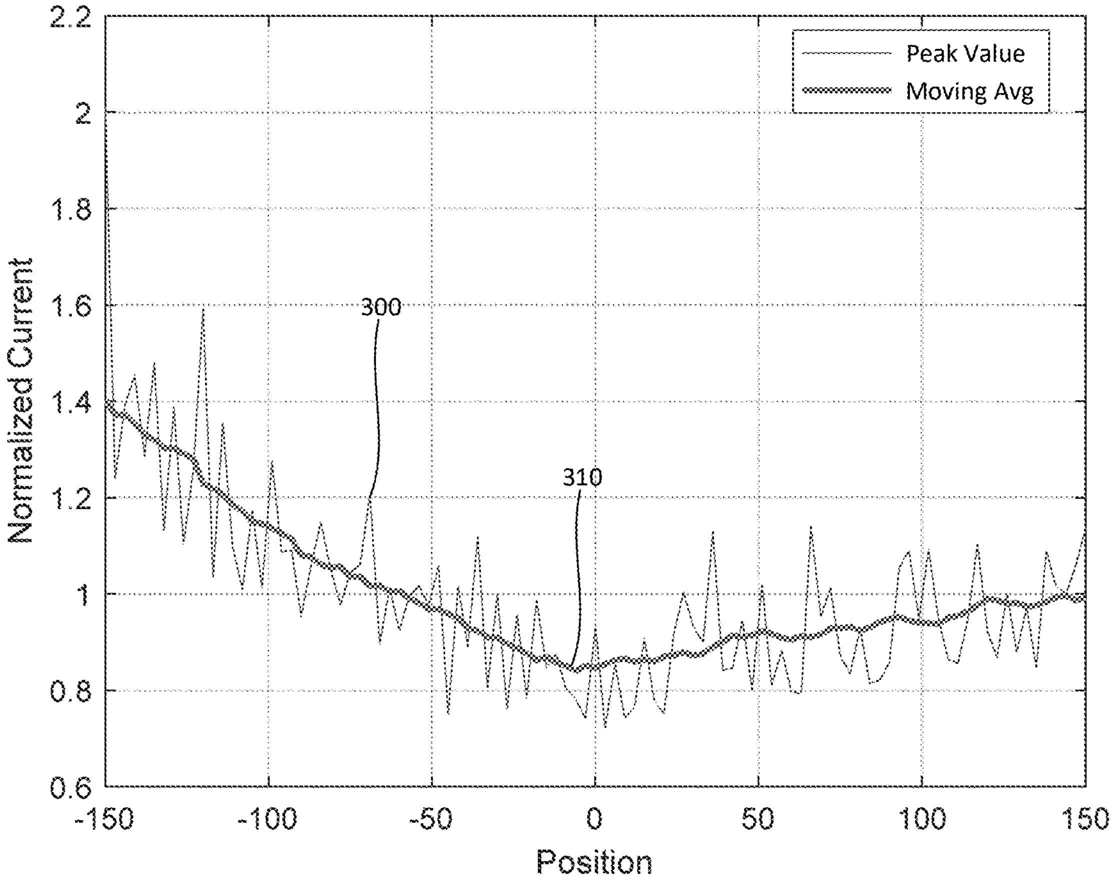
FIG. 6A is a graph illustrating a peak value line and a moving average line associated with the scanned beam profile shown in FIG. 4.

In block 230 of the method shown in FIG. 5, peak current values across the scanned beam profile may be identified and used to generate a "dose rate profile" of the scanned beam 114. For example, for each of the columns of pixels in the scanned beam profile shown in FIG. 4, a single value representing a maximum measured beam current within the column, hereinafter referred to as a "peak value," may be identified. Thus, the peak values in the scanned beam profile represent maximum beam current as a function of horizontal position across the scanned beam 114. Peak value line 300 in the graph shown in FIG. 6A is a plot of peak values associated with the scanned beam profile of FIG. 4. The peak values of the of the scanned beam profile may then be used to derive a dose rate profile of the scanned beam 114, wherein the dose rate profile may be produced by "smoothing" or averaging the peak values. For example, the dose rate profile may be derived by calculating a moving average of the peak values in the peak value line 300, as represented by moving average line 310 in the graph of FIG. 6A. Alternatively, the dose rate profile may be derived by applying a linear fitted line to the peak value line 300. Still further, the dose rate profile may be derived by applying a quadratic fitted line to the peak value line 300. The present disclosure is not limited in this regard, and various other techniques for mathematically smoothing the peak value line 300 may be applied without departing from the embodiments described herein.

In block 240 of the method shown in FIG. 5, one or more metrics may be derived from the dose rate profile, and such metrics may be compared to corresponding dose rate variation targets to determine whether the dose rate profile is satisfactory (i.e., whether the dose rate profile exhibits satisfactory dose rate uniformity). For example, a "dose rate range" may be calculated by subtracting a lowest beam current value in the dose rate profile from a highest beam current value in the dose rate profile, and such dose rate range may be compared against a predetermined maximum threshold value. In another example, a "mean beam current value" may obtained by calculating a mean of the dose rate profile, and such mean beam current value may be compared against a predetermined maximum threshold value and a predetermined minimum threshold value. In another example, a "coefficient of variation" may be obtained by dividing a standard deviation of the dose rate profile by a mean of the dose rate profile, and such coefficient of variation may be compared against a predetermined maximum threshold value. In another example, a linear fitted line may be applied to the dose rate profile (if the dose rate profile was generated using a moving average), and a slope of the linear fitted line may be calculated and compared against a predetermined maximum threshold value, or an R-squared value of the linear fitted line may be calculated and compared against predetermined threshold values (e.g., a predetermined maximum and/or minimum). In another example, a linear quadratic fitted line may be applied to the dose rate profile (if the dose rate profile was generated using a moving average), and a coefficient of fit of the quadratic fitted line may be calculated and compared against a predetermined threshold value, or an R-squared value of the quadratic fitted line may be calculated and compared against a predetermined threshold value.

Figure 6B:
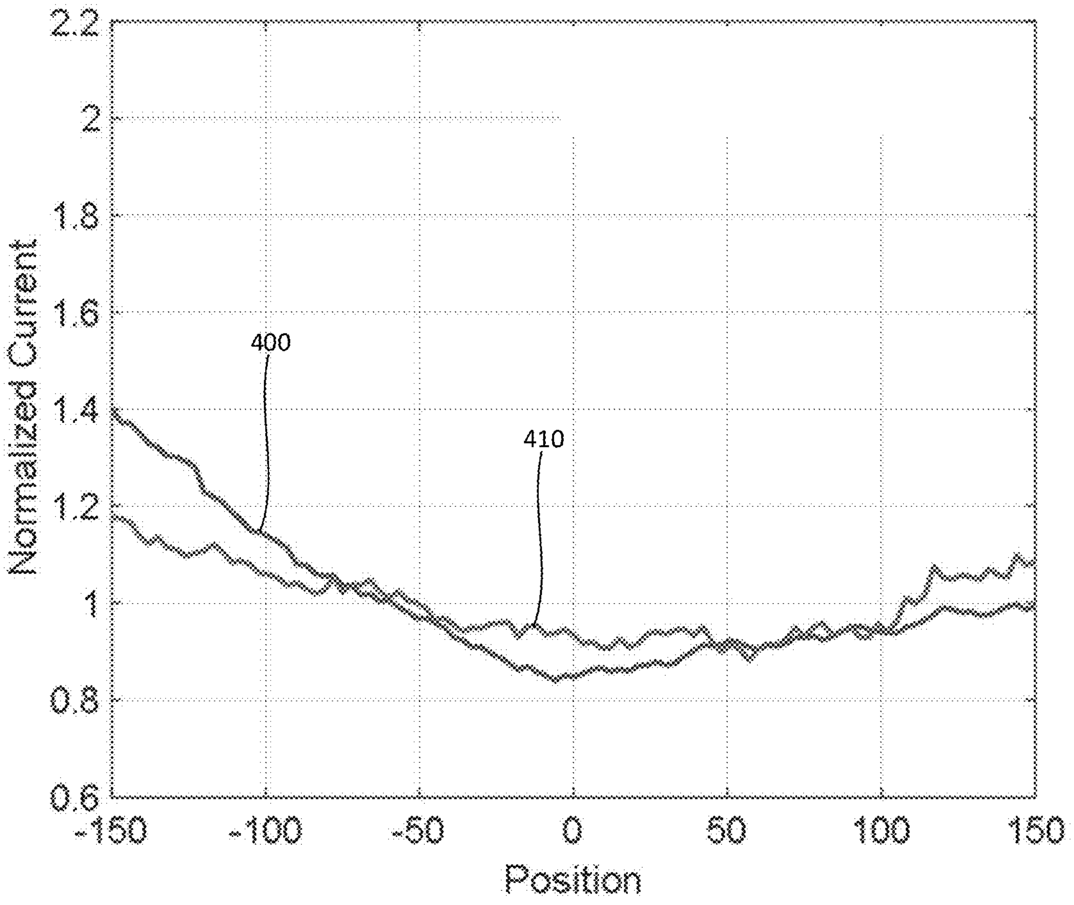
FIG. 6B is a graph comparing a relatively non-uniform dose rate profile of a scanned ion beam to a relatively more uniform dose rate profile of the scanned ion beam.

If the above-described dose rate variation targets are satisfied (e.g., by virtue of favorable comparison of selected metrics to such dose rate variation targets), the settings of the beam shaping components of the ion implanter 100 may be considered to be optimized for producing a scanned beam having satisfactory dose rate uniformity. If the above-described dose rate variation targets are not satisfied (e.g., by virtue of unfavorable comparison of selected metrics to such dose rate variation targets), the beam shaping components of the ion implanter 100 may, in block 250 of the method shown in FIG. 5, be manipulated or adjusted by changing one or more settings of such components via the main controller 140 in a manner intended to produce a more uniform dose rate profile. These settings may include, but are not limited to, positioning of mechanical aperture elements, focus voltage, magnet current, amount of force applied to a force-driven optical element, electrostatic optical element current, post scan suppression, scanner offset, source life, cell suppression, scanned beam velocity, etc. For example, the beam shaping components of the ion implanter 100 may be adjusted to make the scanned beam 114 larger at positions along the X-direction where the dose rate profile indicates relatively higher peak current values, and/or to make the scanned beam 114 smaller at positions along the X-direction where the dose rate profile indicates relatively lower peak current values. The present disclosure is not limited in this regard. Thus, the various beam shaping components of the ion implanter 100 may be associated with one or more tunable parameters than can be changed to affect the shape and/or other attributes of the spot beam 104 and/or the scanned beam 114 to minimize variation in the dose rate profile. For example, referring to FIG. 6B, line 400 represents the dose rate profile of the scanned beam 114 prior to optimization via adjustment of the beam shaping components (i.e., the same dose rate profile represented by moving average line 310 in FIG. 6A), and line 410 represents the dose rate profile of the scanned beam 114 after optimization via adjustment of the beam shaping components.

The profiling, comparison, and adjustment processes of blocks 220-250 of the method shown in FIG. 5 may be repeated until a dose rate profile is produced that satisfies the applicable dose rate variation target(s).

In block 260 of the method shown in FIG. 5, the profiler dose slot 139 may be used to perform a beam current profiling operation, wherein the profiler head 128 is moved across the scanned beam 114 as the profiler dose slot 139 captures an entirety of the height of the scanned beam 114. It will be appreciated that this process may be performed concurrently with the scanned beam profiling operation of block 220 (i.e., during the same horizontal pass of the profiler head 128 across the scanned beam 114). Thus, the profiler dose slot 139 may measure a total beam current of the scanned beam 114 at each horizontal position across the entire width of the scanned beam 114 to develop a beam current profile of the scanned beam 114. Undesirable variations in the total beam current across the scanned beam 114 may thus be identified, and such variations may, at block 270 of the method, be remedied through manipulation of the beam shaping components of the ion implanter 100. This may involve the manipulation of beam current as a function of horizontal position within the scanned beam 114. For example, the scanner 110 of the ion implanter 100 may be operated in a manner that scans the spot beam 104 more slowly across horizontal positions where the beam current is lower (as indicated by the beam current profile) and/or scans the spot beam 104 more quickly across horizontal positions where the beam current is higher (as indicated by the beam current profile). The present disclosure is not limited in this regard. Beam current may thus be made more uniform across the width of the scanned beam 114.

Once the dose rate and the beam current are determined to be sufficiently uniform, the ion implanter 100 may be ready to process a semiconductor workpiece.

Those of skill in the art will appreciate the various advantages provided by the above-described embodiments. For example, the above-described apparatus and method facilitate the expeditious measurement and optimization of dose rate uniformity and beam current uniformity in a scanned ion beam. Furthermore, such measurement and optimization can be performed in an efficient, cost-effective manner that does not involve wasting semiconductor workpieces.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. An ion implantation system, comprising:

an ion source from which a spot beam is extracted;

a scanner which scans the spot beam in a first direction to create a scanned beam directed at a movable workpiece holder adapted to support a semiconductor workpiece;

a movable beam profiler having a profiler head movable in the first direction across a path of the scanned beam, the profiler head including a current sensing array comprising at least one current sensing device adapted to measure a dose rate of the scanned beam for generating a scanned beam profile of the scanned beam;

beam shaping components adapted to change a shape of the spot beam and a shape of the scanned beam; and a main controller operatively coupled to the ion source, the scanner, the movable beam profiler, and the beam shaping components, the main controller adapted to identify peak current values across the scanned beam profile and to derive a first dose rate profile therefrom, the main controller further adapted to adjust settings of the beam shaping components so that the scanned beam has a second dose rate profile that is more uniform than the first dose rate profile.

2. The ion implantation system of claim 1, wherein the profiler head is movable into a position normally occupied by the movable workpiece holder.

3. The ion implantation system of claim 1, wherein the settings of the beam shaping components include at least one of positioning of mechanical aperture elements, focus voltage, magnet current, an amount of force applied to a force-driven optical element, electrostatic optical element current, post scan suppression, scanner offset, cell suppression, and scanned beam velocity.

4. The ion implantation system of claim 1, wherein the main controller is adapted to compare at least one metric associated with the first dose rate profile to at least one corresponding dose rate variation target to determine whether the first dose rate profile is sufficiently uniform.

5. The ion implantation system of claim 1, wherein the first dose rate profile is a moving average of the peak current values.

6. The ion implantation system of claim 1, wherein the controller is adapted to adjust the settings of the beam shaping components to make the scanned beam larger at positions along the first direction where the first dose rate profile indicates relatively higher peak current values.

7. The ion implantation system of claim 1, wherein the controller is adapted to adjust the settings of the beam shaping components to make the scanned beam smaller at positions along the first direction where the first dose rate profile indicates relatively lower peak current values.

8. The ion implantation system of claim 1, wherein the profiler head further includes a profiler dose slot that is at least as tall as the scanned beam in a second direction perpendicular to the first direction, the profiler dose slot comprising a current sensing device adapted to measure a total beam current of the scanned beam as a function of position in the first direction, the main controller adapted to adjust settings of the ion implantation system based on the total beam current measured by the profiler dose slot to make the total beam current more uniform across the scanned beam.

9. A method of measuring and optimizing dose rate variation in an ion implantation system including an ion source from which a spot beam is extracted, a scanner which scans the spot beam in a first direction to create a scanned beam directed at a movable workpiece holder adapted to support a semiconductor workpiece, a movable beam profiler having a profiler head movable in the first direction, and beam shaping components adapted to change a shape of the spot beam and a shape of the scanned beam, the method comprising:

generating the scanned beam according to a beam recipe provided to the ion implantation system;

moving the profiler head across the scanned beam, the profiler head including a current sensing array comprising at least one current sensing device adapted to measure a dose rate of the scanned beam for generating a scanned beam profile of the scanned beam;

identifying peak current values across the scanned beam profile and deriving a first dose rate profile therefrom;

comparing at least one metric associated with the first dose rate profile to at least one corresponding dose rate variation target to determine whether the first dose rate profile is sufficiently uniform; and if the first dose rate profile is not sufficiently uniform, adjusting settings of the beam shaping components so that the scanned beam has a second dose rate profile that is more uniform than the first dose rate profile.

10. The method of claim 9, wherein moving the profiler head comprises moving the profiler head into a position normally occupied by the movable workpiece holder.

11. The method of claim 9, wherein the settings of the beam shaping components include at least one of positioning of mechanical aperture elements, focus voltage, magnet current, an amount of force applied to a force-driven optical element, electrostatic optical element current, post scan suppression, scanner offset, cell suppression, and scanned beam velocity.

12. The method of claim 9, wherein the main controller is adapted to compare at least one metric associated with the first dose rate profile to at least one corresponding dose rate variation target to determine whether the first dose rate profile is sufficiently uniform.

13. The method of claim 9, wherein the first dose rate profile is a moving average of the peak current values.

14. The method of claim 9, wherein adjusting settings of the beam shaping components comprises:

calculating a mean of the first dose rate profile;

adjusting settings of the beam shaping components to make the scanned beam larger if the mean of the first dose rate profile exceeds a predetermined maximum threshold value; and adjusting settings of the beam shaping components to make the scanned beam smaller if the mean of the first dose rate profile falls below a predetermined maximum threshold value.

15. The method of claim 9, wherein adjusting the settings of the beam shaping components comprises making the scanned beam larger at positions along the first direction where the first dose rate profile indicates relatively higher peak current values.

16. The method of claim 9, wherein adjusting the settings of the beam shaping components comprises making the scanned beam smaller at positions along the first direction where the first dose rate profile indicates relatively lower peak current values.

17. The method of claim 9, wherein the profiler head further includes a profiler dose slot that is at least as tall as the scanned beam in a second direction perpendicular to the first direction, the profiler dose slot comprising a current sensing device adapted to measure a total beam current of the scanned beam as a function of position in the first direction, the method further comprising moving the profiler dose slot across the scanned beam in the first direction to measure total beam current in the scanned beam concurrent with the current sensing array being moved across the scanned beam to measure the dose rate of the scanned beam.

18. The method of claim 17, further comprising adjusting settings of the ion implantation system, based on the total beam current measured by the profiler dose slot, to make the total beam current more uniform across the scanned beam.

* * * * *